United States Patent [19]

Stein et al.

[11] 4,211,888

[45] Jul. 8, 1980

[54] ARRANGEMENT WITH SEVERAL THERMAL ELEMENTS IN SERIES CONNECTION

[75] Inventors: Karl-Ulrich Stein, Munich; Heiner Herbst, Haar; Dietrich Widmann, Unterhaching, all of Fed. Rep. of Germany

[73] Assignee: Siemens Aktiengesellschaft, Berlin & Munich, Fed. Rep. of Germany

[21] Appl. No.: 919,827

[22] Filed: Jun. 28, 1978

[30] Foreign Application Priority Data

Jul. 21, 1977 [DE] Fed. Rep. of Germany ....... 2733071

[51] Int. Cl.² ........................................... H01L 35/28
[52] U.S. Cl. ................................... 136/225; 136/211; 136/213; 136/215; 357/15; 357/87
[58] Field of Search ............... 136/205, 211, 212, 213, 136/215, 225; 357/15, 87

[56] References Cited

U.S. PATENT DOCUMENTS

| 3,615,870 | 10/1971 | Crouthamel | 136/211 |
| 4,001,046 | 1/1977 | Weiss et al. | 136/205 |

FOREIGN PATENT DOCUMENTS

| 1137875 | 10/1962 | Fed. Rep. of Germany | 136/213 |
| 1200399 | 9/1965 | Fed. Rep. of Germany | 136/205 |

Primary Examiner—Leland A. Sebastian
Attorney, Agent, or Firm—Hill, Van Santen, Steadman, Chiara & Simpson

[57] ABSTRACT

A thermal element arrangement having a plurality of thermal elements connected in series, and in which an insulation layer has thereon a plurality of metal conductor paths situated on the semiconductor substrate. Each thermal element has one of the metal conductor paths forming a first leg and a semiconductor region forming a second leg. A thermal contact is included having a metal semiconductor contact with the respective semiconductor regions. The semiconductor substrate is less than 10 μm thick in the region where the thermal contacts which are to be heated up is located. Elsewhere, the substrate has a thickness of more than 200 μm which is in that region in which there are situated the contacts which are to be kept cold during the operation of the arrangement. One preferred arrangement has the thermal contacts to be heated during operation surrounded in a star-shaped manner by thermal contacts which are to be kept cold.

12 Claims, 3 Drawing Figures

ARRANGEMENT WITH SEVERAL THERMAL ELEMENTS IN SERIES CONNECTION

INTRODUCTION

The invention relates to an arrangement having several thermal elements in series connection.

BACKGROUND OF THE INVENTION

Thermal elements, as well as series connection of thermal elements in which the thermal elements are formed by metal semiconductor contacts, are known. Among other things, they are also used as infrared detectors with high sensitivity. From U.S. Pat. No. 4,001,046 a thermal element arrangement of this kind is known, which can be produced with the technically well-mastered silicon planar technique. In the arrangement indicated in this U.S. Pat. No. 4,001,046, the active part consists of diffused semiconductor areas and metallic conductor paths which are applied on the surface of a silicon foundation body. Since this silicon foundation body is relatively large, it itself has a high heat capacity. Because of its thermal conductivity, the heat resistance is relatively small between the heated-up metal semiconductor contacts and those which are to be kept cold, so that it is difficult to cool the metal semiconductor contacts which are to be kept cold during operation of the arrangement, without the "hot" thermal contacts which are exposed to the heat radiation not also being cooled. Arrangements are desirable in which it is possible to cool the metal semiconductor contacts which are to be kept cold, without influencing of the contacts which are exposed to a heating-up and which serve for the detection of heat being influenced thereby. Further, arrangements are desirable, with which rapid temperature changes can be followed and which, in addition, have only a small heat capacity.

SUMMARY OF THE INVENTION

Accordingly, it is also the object of the present invention to indicate measures for the construction of a thermal element arrangement, by means of which not only the heat capacity of the entire arrangement, but also the heat resistance between the contacts to be heated up and those to be cooled, can be kept small.

According to the present invention, the semiconductor material, which serves as a carrier for the thermal contacts and is itself inactive, is removed, preferably by etching, in the region of the hotter thermal contacts of the thermal element arrangements. In the region of the colder contacts, the semiconductor material remains in place with a thickness of, for example, 0.2 to 0.5 mm. It is thus assured that the colder contacts can be constantly kept at ambient temperature, since silicon with this thickness has sufficient thermal conductance for cooling the colder contacts. It is, furthermore, achieved, with this arrangement, that the arrangement as a whole is mechanically stable. A thermal element arrangement constructed in a manner hereinafter to be described in which, for instance, the warmer contacts are situated in the middle of a semiconductor chip which is attenuated in its middle, and in which the colder contacts are arranged on the thicker edge region of the chip, can simply be provided with an apertured partition for shielding the colder contacts. An arrangement of this kind can be installed in a housing in a known manner and can be electrically contacted with wire contacting techniques or other known contacting methods.

BRIEF DESCRIPTION OF THE DRAWINGS

In the following, the invention is described and explained more specifically with the aid of the illustrated embodiments represented in the Figures.

DESCRIPTION OF THE PREFERRED EMBODIMENTS

Figure 1:
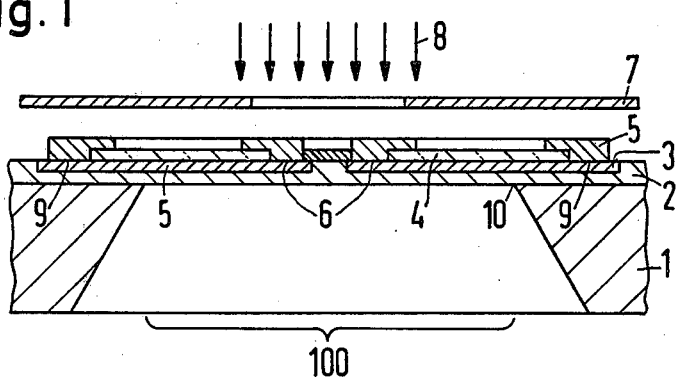
FIG. 1 shows a first preferred embodiment, in which those semiconductor areas with which thermal contacts are formed are embodied as an epitaxial semiconductor layer on a substrate crystal.
Figure 2:
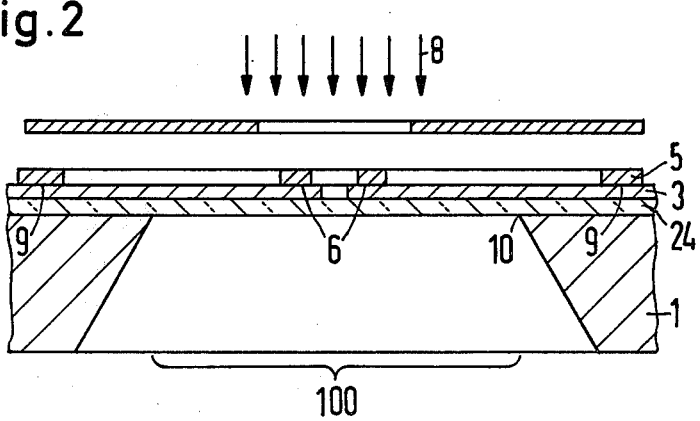
FIG. 2 shows a further preferred embodiment, in which the semiconductor areas used for forming the thermal contacts consist of polycrystalline material.
Figure 3:
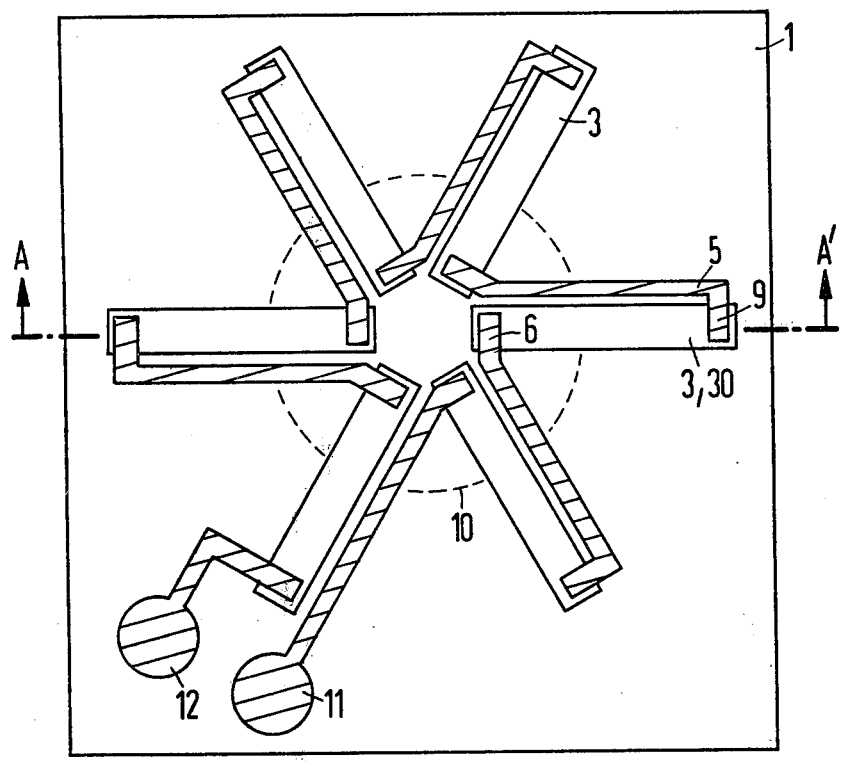
FIG. 3 schematically shows, in a plan view, a layout for an inventive thermal element arrangement.

A first embodiment is represented in FIG. 1. The arrangement is constructed on a semiconductor substrate 1. This semiconductor substrate 1 consists, for example, of n+ doped silicon with a carrier concentration of $10^{20}$ cm$^{-3}$, with this substrate having a thickness of about 0.2 to 0.5 mm. On this substrate is situated an also n-doped epitaxial layer 2 which is about 5 μm thick. This epitaxial layer 2 has a substantially smaller carrier concentration than the substrate. The silicon substrate 1 is etched away down to the epitaxial layer 2 in that region 100 within which the arrangement's thermal contacts 6 which are to be heated up are applied. The edge of this etched-away region is provided with the reference symbol 10 (FIGS. 1, 2, 3). In the epitaxial layer 2 are situated semiconductor regions 3 which are preferably re-doped portions of the epitaxial layer 2. They can also be deposited on the layer 2 as a further epitaxial layer. These regions 3 are strongly p-doped with a charge carrier concentration of about $10^{19}$ cm$^{-3}$. The semiconductor regions 3 represent those semiconductor regions with which the metal conductor paths 5 form the thermal contacts 9 and 6. An insulating layer 4 of SiO$_2$ can be applied on these semiconductor regions 3 for insulation of the metal conductor paths which respectively form the other side of the thermal contacts. This insulating layer 4 is provided with contact holes at the points provided for the thermal contacts 6 and 9. With the exception of the contact regions, the conductor paths 5 can also run laterally from the semiconductor regions 3 (FIG. 3). In another embodiment, the semiconductor regions 3 are re-doped parts of the epitaxial layer 2. The thermal contacts 6 which are situated inside the thinly etched region 100 of the substrate 1 are exposed to the heat radiation 8 which is to be detected, while the thermal contacts 9 which are situated outside this region 100 are cooled and, by means of a diaphragm 7, shielded from the heat radiation 8 to be detected.

FIG. 2 shows a further embodiment. In this embodiment a silicon dioxide layer 24 is situated on the substrate 1, which consists, for instance, of silicon. The substrate 1 is also etched-away in the region 100 within which the thermal contacts 6 which are to be heated up are situated. On the substrate 1 is located an electrically insulating layer 24, for instance a silicon dioxide layer. This insulating layer 24 has a thickness of about 5 μm. On this insulating layer 24 are located strips 30 of polycrystalline silicon which represent those semiconductor areas 3 with which the thermal contacts 6, 9 are formed. These polycrystalline silicon strips 30 have a thickness of about 2 μm and are doped, for example, with boron or phosphorus, with a doping strength of $10^{19}$ cm$^{-3}$. The conductor paths 5 run outside the polycrystalline silicon strips 30 on the insulating layer 24 and form, at their ends, thermal contacts 6 or, respectively, 9 with these Si regions 30 (compare FIG. 3). During operation, the contacts 9 which are to be kept cool are covered by a diaphragm 7. For reducing the heat capacity, the insulating layer 24 can be removed under the contacts 6 to be heated. The sectional drawing of FIG. 2 corresponds approximately to the section A-A' of the layout represented in FIG. 3.

FIG. 3 schematically shows a plan view of an inventive arrangement of thermal elements. The semiconductor regions 3 with which the thermal contacts 6 or, respectively, 9 of the metal conductor paths 5 are formed are constructed as strips and are arranged in a star-shape. Those thermal contacts which are exposed to heating-up are situated inside a circular region 100, whose edge is indicated by the broken line 10 and in which the substrate 1 is thinly etched. There are contact spots 11 and 12 provided for attaching the outside contacts. For a better overall view, the insulating layer 24 is not represented in FIG. 3.

The production of an inventive thermal element arrangement as represented in FIG. 1 is preferably carried out in that, on a silicon substrate 1, which has a thickness of, for example, between 200 and 500 μm and is doped n-conductive with a phosphorus concentration of about $10^{20}$ cm$^{-3}$, there is applied, by means of epitaxy, a layer 2 which is, for example, 7 μm thick, and n-doped with phosphorus, with a carrier concentration of $10^{15}$ cm$^{-3}$. Then, by means of, for example, ion implantation or by means of diffusion, regions 3 of this n-doped layer are strongly p-doped by means of suitable masks. Subsequently, an insulation layer 4 is deposited on the layer 2 or, respectively, on the semiconductor regions 3. This insulation layer 4 is provided with contact holes for the thermal contacts 6 or, respectively, 9, for example, with the aid of a photolithographic process. Then, for example, also with a photolithographic process, the conductor paths 5 are deposited on this insulation layer 4. The conductor paths 5 consist for example, of aluminum. After the thermal contacts have been produced in this manner, the substrate 1 is etched away, from the rear of the arrangement, up to the epitaxial layer 2, said etching-away being done within a region 100 which lies around the contacts 6 to be heated up. For the etching-away, a process described in "Journal of Electrochemical Society" 117 (1970), pages 553 and following, is preferably employed. In this electrochemical etching process, the silicon substrate, which is strongly n-doped with phosphorus, is much more rapidly removed than a weakly n-doped silicon which has been doped with phorphorus, with a carrier concentration of less than $10^{16}$ cm$^{-3}$, so that an etching stop automatically occurs at the epitaxial layer 2. The etching-away of the substrate 1 is preferably not carried out until the end of the production process, since the structures remaining after the etching-away and lying within the region 100 are relatively thin and thus mechanically sensitive.

In the sample embodiment represented in FIG. 2, the silicon substrate 1 is completely etched away within the region 100. In this sample embodiment, the silicon dioxide layer 24 under the strips 30 of polycrystalline silicon can, as well, be etched away in the region of the contacts 6.

It will be apparent to those skilled in the art that many modifications and variations may be effected without departing from the spirit and scope of the novel concepts of the present invention.

We claim as our invention:

1. Thermal element arrangement having several thermal elements in series connection, in which an insulation layer having thereupon several metal conductor paths is situated on a semiconductor substrate, in which each thermal element has one of said metal conductor paths as a first leg, a semiconductor region as a second leg and, as a thermal contact, a metal semiconductor contact of said metal conductor paths with the respective semiconductor region, said semiconductor substrate being less than 10 μm thick in that region where said thermal contacts are to be heated during operation of said arrangement, and is more than 200 μm thick in that region in which are situated the contacts which are to be kept cold during operation of the arrangment, said semiconductor substrate having thereon an epitaxial semiconductor layer which is less doped vis-a-vis said substrate and which adjoins the surface of said substrate.

2. Thermal element having several thermal elements in series connection, in which an insulation layer on a semiconductor substrate, in which each thermal element has one of said metal conductor paths as a first leg, a semiconductor region as a second leg, and, as a thermal contact, a metal semiconductor contact of said metal conductor paths with the respective semiconductor region, said semiconductor substrate being less than 10 μm thick in that region where said thermal contacts are to be heated during operation of said arrangement, and is more than 200 μm thick in that region in which are situated the contacts which are to be kept in cold during operation of the arrangement, said thermal contacts which are to be heated during operation are surrounded in a star-shaped manner by thermal contacts which are to be kept cold, said semiconductor substrate, having an epitaxial semiconductor layer which is less doped vis-a-vis the said substrate and which adjoins the surface of said substrate.

3. Arrangement according to claim 1, in which on said epitaxial semiconductor layer, there are epitaxial semiconductor regions doped oppositely to said epitaxial layer.

4. Arrangement according to claim 1, in which on said first epitaxial semiconductor layer, there are epitaxial semiconductor regions doped oppositely to said epitaxial layer.

5. Arrangement according to claim 1, in which said epitaxial semiconductor layer has doped regions separated from one another, which have a conductivity type opposite to said epitaxial layer.

6. Arrangement according to claim 4, in which said epitaxial semiconductor layer has doped regions separated from one another, which have a conductivity type opposite to said epitaxial layer.

7. Arrangement according to claim 1, in which said semiconductor substrate, as well as said semiconductor layers, consist of silicon.

8. Arrangement according to claim 3, in which said semiconductor substrate is strongly n-doped; said epitaxial layer is weakly n-doped; and said epitaxial semiconductor regions are strongly p-doped.

9. Arrangement according to claim 1, in which said semiconductor regions with which thermal contacts are formed are strips of polycrystalline silicon.

10. Arrangement according to claim 1, in which said electrically insulating layer is removed below the contacts to be heated.

11. Arrangement according to claim 1, in which a diaphragm is provided which shields, from incident heat radiation, the contacts to be kept cold, and which leaves exposed the contacts to be heated.

12. Arrangement according to claim 1, in which said metal conductor paths are formed of aluminum.

* * * * *